United States Patent [19]

Jeng

[11] Patent Number: 5,661,073
[45] Date of Patent: Aug. 26, 1997

[54] METHOD FOR FORMING FIELD OXIDE HAVING UNIFORM THICKNESS

[75] Inventor: Nanseng Jeng, Boise, Id.

[73] Assignee: Micron Technology, Inc., Boise, Id.

[21] Appl. No.: 514,159

[22] Filed: Aug. 11, 1995

[51] Int. Cl.$^6$ .................................................. H01L 21/76
[52] U.S. Cl. .................... 438/431; 438/437; 438/444; 438/702
[58] Field of Search ............................. 437/67, 69, 72; 148/DIG. 85, DIG. 86, DIG. 117

[56] References Cited

U.S. PATENT DOCUMENTS

| | | | |
|---|---|---|---|
| 4,512,073 | 4/1985 | Hsu | 29/571 |
| 5,077,234 | 12/1991 | Scoopo et al. | 437/67 |
| 5,416,348 | 5/1995 | Jeng | 257/297 |
| 5,438,016 | 8/1995 | Figura et al. | 437/67 |
| 5,455,194 | 10/1995 | Vaquez et al. | 437/67 |
| 5,504,033 | 4/1996 | Bajor et al. | 437/72 |
| 5,538,916 | 7/1996 | Kuroi et al. | 437/72 |

FOREIGN PATENT DOCUMENTS

| | | | |
|---|---|---|---|
| 000498717 | 8/1992 | European Pat. Off. | 437/72 |
| 0102048 | 6/1982 | Japan | 437/72 |
| 0168233 | 10/1983 | Japan | 437/72 |
| 0190040 | 11/1983 | Japan | 437/72 |
| 0050540 | 3/1984 | Japan | 437/67 |
| 0065446 | 4/1984 | Japan | 437/72 |
| 0232437 | 12/1984 | Japan | 437/72 |
| 0105247 | 6/1985 | Japan | 437/72 |
| 0133739 | 7/1985 | Japan | 437/72 |
| 0142535 | 7/1985 | Japan | 437/67 |
| 0145638 | 8/1985 | Japan | 437/72 |
| 0046543 | 2/1987 | Japan | 437/67 |
| 362040740 | 2/1987 | Japan | 437/67 |
| 0048049 | 3/1987 | Japan | 437/67 |
| 0020635 | 1/1989 | Japan | 437/67 |
| 0032646 | 2/1989 | Japan | 437/67 |
| 0050430 | 2/1990 | Japan | 437/72 |
| 00504430 | 2/1990 | Japan | 437/72 |

OTHER PUBLICATIONS

D. H. Ahn, S. J. Ahn, P. B. Griffin*, M. W. Hwang, W. S. Lee, S. T. Ahn, C. G. Hwang, and M. Y. Lee, "A Highly Modified LOCOS Isolation Technology for the 256 Mbit DRAM", IEDM, 1994, pp. 28.3.1.–28.3.4.

Primary Examiner—John Niebling
Assistant Examiner—Long Pham

[57] ABSTRACT

A method for forming a semiconductor device comprises the steps of providing a semiconductor substrate having first and second surfaces, the second surface having an inferior plane with respect to the first surface. An oxidizing-resistant layer such as nitride is formed on the first surface, and an oxidizable material is formed over the first and second surfaces. A protective material is formed over the first and second surfaces, which is then removed from the first surface. Subsequent to the step of removing the protective material from the first surface, the oxidizable material is removed from the first surface and is left over the second surface. Subsequent to the step of removing the oxidizable material from the first surface, the protective material is removed from the second surface and the oxidizable material remains over the second surface. Subsequent to removing the protective material from the second surface, the oxidizable material on the second surface is oxidized. A field oxide formed by oxidizing the poly can be self-limiting and very uniform, thereby avoiding the commonly observed field oxide thinning effect in tight pitch areas.

14 Claims, 2 Drawing Sheets

METHOD FOR FORMING FIELD OXIDE HAVING UNIFORM THICKNESS

FIELD OF THE INVENTION

The invention relates to the field of semiconductor manufacture, and more specifically to the formation of an isolation region such as field oxide.

BACKGROUND OF THE INVENTION

Many types of semiconductor devices such as dynamic random access memories (DRAMs), static rams (SRAMs), and programmable memories are formed in much the same way. Layers of oxide, nitride, and polycrystalline silicon (polysilicon or poly) are formed over a substrate such as silicon to form field and gate oxide, capacitor cell plates, word and digit lines, and various other structures.

To form a thick oxide layer such as field oxide, a thin blanket oxide layer is formed over a substrate. A blanket layer of protective material such as nitride is formed over the oxide layer, and a patterned mask is formed over the protective layer to cover regions of protective material and leaving other regions of protective material exposed. The exposed protective regions (and often the underlying oxide layer) are etched to expose the underlying oxide layer (or underlying substrate). The substrate is then oxidized to form the field oxide.

Depending on the design of the device being formed, the field oxide can often require varying distances between an adjacent field oxide, for example to form active areas within the substrate. To form the field oxide, areas of material which resist oxide formation (such as nitride) are formed which have varying distances between the areas. The distance between the nitride areas can vary depending on the design of the device. For example, the distance between a first area and a second area can be less than a distance between the second area and a third area, depending on the active areas required for a particular design of the device. One problem which can result from differing distances between structures is field oxide thinning. When the substrate is oxidized, the smaller distance between first and second areas forms a thinner field oxide than the wider area between the second and third areas. This difference in field oxide thickness can result in a device that has less desirable electrical characteristics than a device in which the field oxide thickness is uniform across the device. A process for reducing field oxide thinning in the narrow regions would be desirable.

SUMMARY OF THE INVENTION

A method for forming a semiconductor device comprises the steps of forming a blanket layer of material over a substrate, forming a protective layer over a first portion of the material and leaving a second portion of the material exposed, and removing the exposed second portion of the material. Next, an insulator is formed from at least a portion of the first portion of the material.

Objects and advantages will become apparent to those skilled in the art from the following detailed description read in conjunction with the appended claims and the attached drawings.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE PREFERRED EMBODIMENTS

Figure 1:
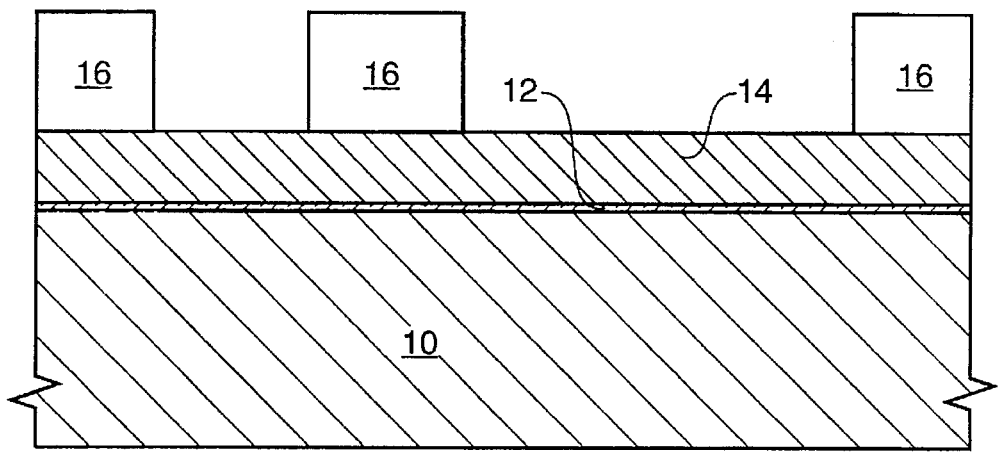
FIG. 1 is a cross section showing a starting structure.

FIG. 1 is a cross section showing a starting structure for practicing an embodiment of the inventive method. Particularly, a substrate 10 such as a wafer of silicon has formed thereon an, oxide layer 12, and a blanket layer which resists the formation of an isolation material, for example nitride 14. The oxide layer 12 is not required for the practice of the invention, but may reduce damage to the silicon as the nitride is formed and during field oxidation. Materials other than oxide may function to reduce damage to the substrate during formation of layer 14.

Figure 2:
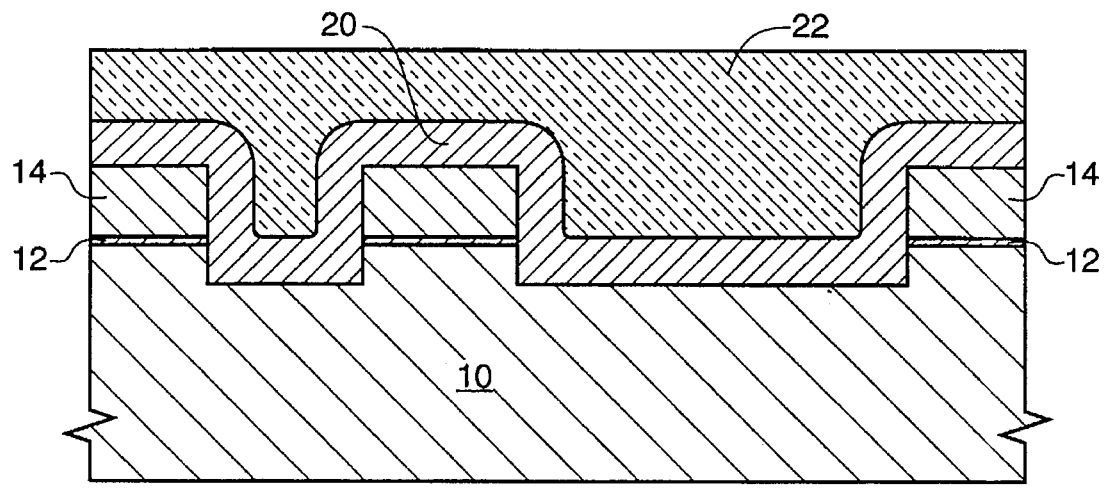
FIG. 2 is a cross section showing the FIG. 1 structure after an etch and layer formation.

Also shown in FIG. 1 is a patterned mask layer 16. An etch is performed to remove exposed portions of the nitride layer 14 and oxide layer 12 and etches a portion of the exposed substrate as shown in FIG. 2 to form a recess in the substrate. "If a recess is formed, a semiconductor substrate is thus provided which has first and second surfaces with the second surface (the bottom of the trench) having an inferior plane with respect to the first surface (the unetched substrate)." A recess of between about 200 angstroms (Å) and about 2000 Å would be sufficient, although other recess depths may be sufficient. It should be noted that etching the substrate is not required, and in an alternate embodiment of the invention the substrate is not etched.

Next, as shown in FIG. 2, a blanket layer of material 20 is formed over the substrate and directly on the substrate at the recesses. The material used for 20 is a material capable of forming an insulator, for example by oxidizing the material. Doped or undoped polycrystalline silicon (poly) or amorphous silicon would function sufficiently. For purposes of illustration only, poly is used to describe the embodiments in the following text, though other materials may function sufficiently.

A protective planar layer 22 such as tetraethyl orthosilicate (TEOS), borophosphosilicate glass (BPSG), spun-on glass (SOG), or photoresist is formed over poly 20. Any material which can be etched selective to material 20 would function sufficiently. Planarization of layer 22 can be performed by means such as mechanical, chemical, or chemical-mechanical planarization, by reflow, self-planarization during deposition, or by other workable means. In any case, the protective layer 22 is etched using a vertical etch to result in the structure of FIG. 3 wherein the protective layer 22 is formed over first portions of the poly 20 and second portions of the poly are left exposed. The exposed portions of the poly 20 are then removed, for example using an anisotropic or isotropic etch, to result in the structure of FIG. 4. In the case where a recess is formed, at least part of the poly is within the recess.

Figure 3:
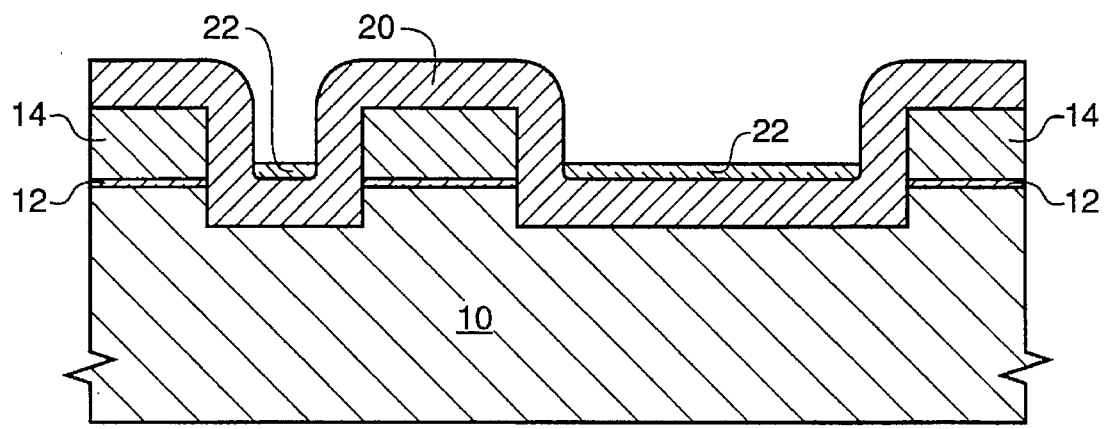
FIG. 3 is a cross section showing the FIG. 2 structure after various additional process steps.

The etching of protective layer 22 and poly 20 can be done in two etch steps, the first etch removing the protective layer 22 to the level shown in FIG. 3 and leaving poly 20 covering elements 14. The second etch, which can be an isotropic or anisotropic etch, removes poly 20 which is uncovered by protective layer 22. The protective layer 22 reduces the etching of poly 20.

In an alternate embodiment, the etching of protective layer 22 and poly 20 can also be performed in a single etch step if an etch is used which removes both layers 22 and 20. Nitride 14 can be etched along with the protective layer 22 and poly 20, as long as adequate nitride 14 remains after the etch to substantially prevent the underlying substrate from oxidizing during subsequent steps.

Figure 4:
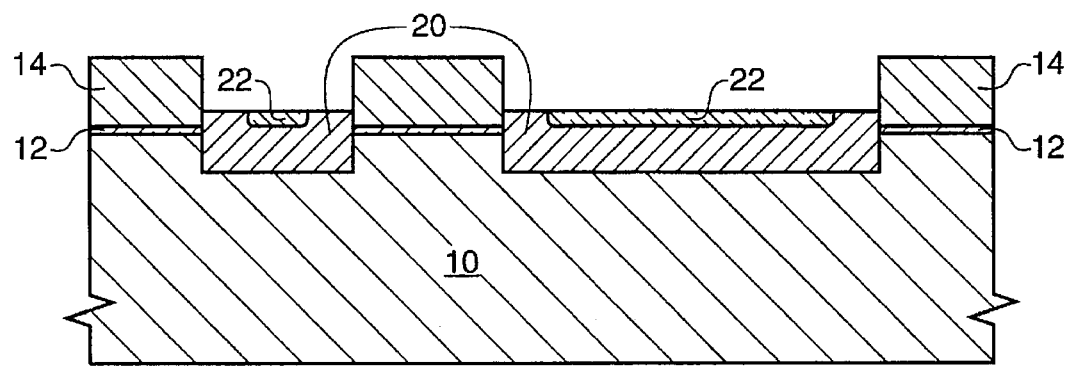
FIG. 4 is a cross section showing the FIG. 3 structure after an etch.
Figure 5:
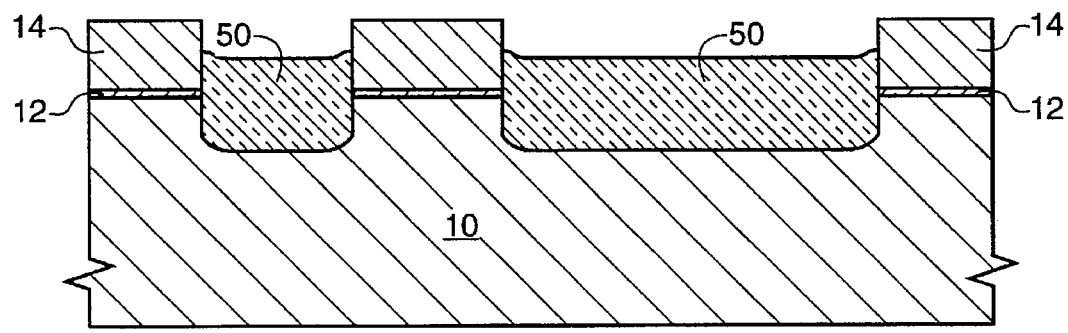
FIG. 5 is a cross section showing the FIG. 4 structure after forming an isolation region.

After layer 22 and material 20 are etched to form the structure of FIG. 4, the protective layer 22 is removed while the remaining poly 20 shown in FIG. 4 remains substantially intact. This results in a structure similar to FIG. 4 with layer 22 removed. Subsequently, an insulator such as oxide is formed from at least a portion of the remaining poly 20 to result in the structure of FIG. 5 which shows oxide 50, for example for use as field oxide. Wafer processing then continues, for example to form transistors.

With the inventive process the poly 20 of FIG. 4 oxidizes at a faster rate than the silicon substrate, usually at least twice as fast. A large percentage of the field oxide 50 is formed by oxidizing poly 20. As the poly is consumed by the oxidation process the oxidation begins to slow and the oxide formation is thereby somewhat self-limiting. The inventive process can result in a more uniform oxide than is produced with conventional field oxide formation which suffers from the commonly observed field oxide thinning effect in tight pitch areas.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, various materials can be used for the layers described. It is therefore contemplated that the appended claims will cover any such modifications or embodiments as fall within the true scope of the invention.

I claim:

1. A method for forming a semiconductor device comprising the following steps:

forming a patterned nitride layer over first portions of a silicon substrate and leaving second portions of said substrate uncovered by said nitride, said second portions of said substrate having a recess therein;

forming an oxidizable layer over said first portions of said substrate and directly on said second portions of said silicon substrate;

forming a protective layer over said second portions of said substrate;

subsequent to forming said protective layer, removing said oxidizable layer from said first portions of said substrate;

exposing at least a portion of said oxidizable layer at said second portions of said substrate; and subsequent to exposing at least a portion of said oxidizable layer, oxidizing said oxidizable layer.

2. The method of claim 1 wherein said oxidizing said oxidizable layer forms field oxide.

3. The method of claim 2 wherein said protective layer comprises a material selected from the group consisting of tetraethyl orthosilicate, photoresist, borophosphosilicate glass, and spun on glass.

4. The method of claim 2 wherein said recess is less than about 2000 Å deep.

5. The method of claim 2 wherein said recess is between about 200 Å and about 2000 Å deep.

6. The method of claim 2 further comprising the steps of:
   forming a blanket nitride layer;
   etching said blanket nitride layer to form said patterned nitride layer and etching said substrate to form said recess using a single etch step.

7. The method of claim 1 wherein said oxidizable layer comprises polycrystalline silicon.

8. A method for forming a semiconductor device comprising the following steps:

providing a semiconductor substrate having first and second surfaces, said second surface having an inferior plane with respect to said first surface;

providing an oxidizing-resistant layer on said first surface;

forming an oxidizable material over said first surface and directly on said second surface of said semiconductor substrate;

forming a layer of protective material over said first and second surfaces;

removing said protective material from said first surface;

subsequent to said step of removing said protective material from said first surface, removing said oxidizable material from said first surface and leaving said oxidizable material and said protective material over said second surface;

subsequent to said step of removing said oxidizable material from said first surface, removing said protective material from said second surface and leaving said oxidizable material over said second surface; and subsequent to removing said protective material from said second surface, oxidizing said oxidizable material on said second surface.

9. The method of claim 8 wherein oxidizing said oxidizable material forms field oxide.

10. The method of claim 8 wherein said oxidizing-resistant layer is removed subsequent to said step of oxidizing said oxidizable material.

11. The method of claim 8 wherein said oxidizing-resistant layer is nitride and said oxidizable material is silicon.

12. The method of claim 11 wherein said material comprises a substance selected from the group consisting of polycrystalline silicon and amorphous silicon.

13. The method of claim 8 further comprising forming an oxide layer under said oxidizing-resistant layer.

14. The method of claim 1 wherein said step of exposing said portion of said oxidizable layer is performed during said step of removing said oxidizable layer.

* * * * *

UNITED STATES PATENT AND TRADEMARK OFFICE
CERTIFICATE OF CORRECTION

PATENT NO. : 5,661,073
DATED : Aug. 26, 1997
INVENTOR(S) : Nanseng Jeng

It is certified that error appears in the above-identified patent and that said Letters Patent is hereby corrected as shown below:

Column 2, line 18, after "an" please delete "," (the comma).

Column 2, line 29, before "If" please remove the quotation mark.

Column 2, line 33, after "substrate)." please remove the quotation mark.

Signed and Sealed this

Twenty-first Day of April, 1998

Attest:

BRUCE LEHMAN

*Attesting Officer*  *Commissioner of Patents and Trademarks*